United States Patent
Muravsky et al.

(10) Patent No.: US 7,166,474 B2
(45) Date of Patent: Jan. 23, 2007

(54) METHOD FOR THE ESR-SPECTROSCOPIC DETECTION OF CHANGES IN THE TRANSPORT PROPERTIES OF ALBUMIN IN AN ALBUMIN-CONTAINING SAMPLES, ESR-SPECTROMETER FOR CARRYING OUT SAID METHOD, AND USE OF THE METHOD FOR DIAGNOSTIC PURPOSES AND FOR CONTROLLING ALBUMIN-CONTAINING PREPARATIONS

(75) Inventors: Vladimir A. Muravsky, Minsk (BY); Alexander Milutin, Minsk (BY); Gert A. Matthes, Berlin (DE); Günter Seibt, Eichwalde (DE)

(73) Assignee: E. W. Handels-und Consulting GmbH, Eichwalde (DE)

( * ) Notice: Subject to any disclaimer, the term of this patent is extended or adjusted under 35 U.S.C. 154(b) by 620 days.

(21) Appl. No.: 10/220,170

(22) PCT Filed: Feb. 28, 2001

(86) PCT No.: PCT/EP01/02248

§ 371 (c)(1),
(2), (4) Date: Nov. 26, 2002

(87) PCT Pub. No.: WO01/65270

PCT Pub. Date: Sep. 7, 2001

(65) Prior Publication Data

US 2003/0170912 A1 Sep. 11, 2003

(30) Foreign Application Priority Data

Feb. 28, 2000 (DE) .................... 100 11 163

(51) Int. Cl.
*G01N 24/00* (2006.01)

(52) U.S. Cl. .................. 436/173; 435/7.1; 435/810; 435/975; 436/808

(58) Field of Classification Search .................. None
See application file for complete search history.

(56) References Cited

U.S. PATENT DOCUMENTS 5,629,625 A 5/1997 Ringeisen et al. .......... 324/316

FOREIGN PATENT DOCUMENTS

DE 3726051 A1 2/1989
DE 198 34 939 A1 2/2000

(Continued)

OTHER PUBLICATIONS

V. A. Ryzhov, et al. "Spectrometer for studying broad magnetic dipole transitions in magnets and the Hall conductivity at microwave frequencies in conducting materials," Tech. Phys. 40 (1), Woodbury, Massachusetts, Jan. 1995.

(Continued)

*Primary Examiner*—Christopher L. Chin
(74) *Attorney, Agent, or Firm*—Norris McLaughlin & Marcus PA (57) ABSTRACT

The invention relates to method for the ESR-spectroscopic detection of changes in the transport properties of albumin in an albumin-containing sample. Said method can be used in the medical, biological, biotechnological and veterinary praxis for diagnostic purposes and/or for monitoring physiological or pathological changes in the human or animal body or for the quality control of albumin-containing preparations, especially blood products. The invention further relates to an ESR spectrometer for carrying out the inventive method, which—being an automated ESR analyzer—allows for a simple and reliable handling required in modern clinical laboratories. The inventive ESR spectrometer integrates automatic device controls, signal registration and signal evaluation in combination with a computer program for the diagnostic analysis of the measured data.

21 Claims, 3 Drawing Sheets

FOREIGN PATENT DOCUMENTS

| | | |
|---|---|---|
| DE | 693 28 989 T2 | 12/2000 |
| EP | 0 570 592 A1 | 6/1993 |
| EP | 0 973 043 A1 | 1/2000 |
| SU | 1319705 A1 | 6/1984 |
| WO | WO 96/21867 | 7/1996 |

OTHER PUBLICATIONS

Keith P. Madden, et al., "Computer Controller *in situ* radiolysis electron spin resonance spectrometer incorporating magnetic field-microwave frequency locking,," Rev. Sci. Instrumen. 65 (1), Jan. 1994, American Institute of Physics.

Tsvetan G. Gantchev, "Binding Interactions and Conformational Changes Induced by Sulfonated Aluminum Phthalocyanines in Human Serum Albumin," Archives of Biochemistry and Biophysics, vol. 366, No. 1, Jun. 1, 1999, pp. 21-30.

METHOD FOR THE ESR-SPECTROSCOPIC DETECTION OF CHANGES IN THE TRANSPORT PROPERTIES OF ALBUMIN IN AN ALBUMIN-CONTAINING SAMPLES, ESR-SPECTROMETER FOR CARRYING OUT SAID METHOD, AND USE OF THE METHOD FOR DIAGNOSTIC PURPOSES AND FOR CONTROLLING ALBUMIN-CONTAINING PREPARATIONS

BACKGROUND OF THE INVENTION

The invention relates to a method for the electron spin resonance (ESR)-spectroscopic determination of changes in the transport properties of albumin in an albumin-containing sample, which method is applicable in the medical, biological, biotechnological and veterinary practice and useful in diagnosing and/or monitoring physiological or pathological changes in a human or animal body, or in the quality control of albumin-containing preparations, particularly blood products. The invention is also directed to an ESR spectrometer for performing the method according to the invention.

The utilization of hematologic parameters or of parameters relating to antigens, hormones, enzymes, and other biologically active substances in the diagnosis of diseases is well-known and widely used in clinical-chemical routine diagnostics.

Similarly, NMR and ESR spectroscopy can be used in clinical diagnostics to detect structural and functional properties of protein and lipid components in blood serum. While the use of ESR spectroscopy employing spin labels to investigate the movement behavior in macromolecules represents the well-known state of the art, the extensive introduction of this testing method in clinical routine diagnostics has failed heretofore due to high cost of equipment and complicated or non-reliable analysis of the signals.

SU 1319705 A1 describes a method of diagnosing malignant diseases by measuring the ability of blood plasma or blood serum to bind an incorporated spin probe, using ESR. Therein, the binding coefficient $\alpha$ representing the ratio of the peak A amplitude to the peak B amplitude is determined. If $\alpha > 1$, a cancerous disease is present. If $\alpha < 1$, the subject is healthy.

The described method involves the disadvantage of operating with insufficient sensitivity, thus being incapable of providing a reliable diagnosis. Investigations on this method have shown the false-positive and false-negative diagnostic data at an early stage of disease to be $\geq 30\%$.

EP 0,973,043 A1 describes an ESR-spectroscopic method of diagnosing malignant neoplasms in blood serum, wherein physicochemical parameters of the mobility of a spin probe represented by a spin-labelled fatty acid are determined in the three binding sites of albumin.

Albumin is the main component in the transport system of blood, enabling the transport of fatty acids, tryptophane, bilirubin, calcium, steroid hormones, and other functionally significant active substances to the target cell, and being involved in binding and distribution of a variety of toxins (including those of endogenous origin). Albumin is a polypeptide (molecular weight 68,000) having a high binding capacity for exogenous (drugs) and endogenous substances. It is comprised of 585 amino acids arranged in a loop structure via disulfide bridges. The literature differentiates between distinct binding sites on serum albumin. For fatty acids, there are the so-called binding sites 1, 2 and 3 on the albumin molecule.

In the diagnostic method according to EP 0,973,043 A1, a cancerous disease is detected using the deviation of the parameters of spin probe binding from those values exhibited by healthy subjects.

Thus, the ESR method according to EP 0,973,043 A1 detects the concrete native conformational state of albumin in blood, which differs from that of a healthy subject in the presence of a cancerous pathology. This method has been found to produce false-positive or false-negative results in the presence of additional effects on albumin from the blood, e.g. elevated blood lipid values, ingestion of medicaments, or effects caused by the solvent of the spin probe or by storing the blood sample on air.

SUMMARY OF THE INVENTION

It is the object of the present invention to provide a low-cost, rapidly performable method for the ESR-spectroscopic determination of samples containing albumin, particularly blood samples, which method would allow correct and reproducible statements as to the conformation of the albumin, considering the above-mentioned effects, and would be applicable in the clinical-chemical laboratory practice. The method is intended to be suitable in the early diagnosis and/or in monitoring of physiological or pathological changes in the human or animal body, in the quality control of materials containing albumin, particularly of stored blood, and in assessing the detoxification capacity of albumin molecules. It is another object of the invention to provide an apparatus to perform said method with advantage.

The object of the invention is accomplished in that the changes in the transport properties of the albumin in the sample to be investigated are determined with ESR spectroscopy by inducing specific conformational changes of the albumin molecule, using a polar reagent with addition of a suitable spin probe. The parameters of binding of a spin probe to specific, well-known binding sites of the albumin, which can be determined by means of ESR, were found to correlate with biophysical parameters of the albumin conformation, the latter allowing reliable statements as to the physiological or pathological changes in a human or animal body, and also in preparations related to transfusion or transplantation medicine.

DETAILED DESCRIPTION OF THE PREFERRED EMBODIMENTS

According to the invention, aliquots of the sample are added with at least three, preferably up to eight different concentrations of a spin probe binding to albumin and, in addition, with at least three, preferably up to eight different concentrations of a polar reagent, the degree of change in the parameters of binding of the spin probe to specific binding sites of the albumin as a function of the spin probe concentration and the concentration of polar reagent is determined with reference to the ESR spectra of the aliquots added with spin probe and polar reagent, using a computer simulation of the ESR spectra, and the change in the transport properties of the albumin is calculated from the changes of the values of the binding parameters of the spin probe for the conformational states of the albumin induced by the different concentrations of spin probe and polar reagent, the concentrations of spin probe to be added being selected in such a way that the mean value of the ratio of spin probe concentration to albumin concentration is 2.5±0.5 and, starting from this mean value, at least two additional concentrations are selected whose deviation from this mean value is no less than 1.0. The concentrations of polar reagent to be added are selected in such a way that the mean value of the final concentration of polar reagent in the aliquots is (0.6±0.25)·Cp, wherein Cp represents the critical concentration of polar reagent, surpassing of which would result in denaturing of the albumin, and, starting from this mean value, at least two additional concentrations of polar reagent are selected, whose deviation from this mean value is at least 15%.

The concentrations of spin probe and polar reagent added to the respective aliquots must be selected within the indicated concentration ranges in such a way that at least one aliquot would include a low concentration of probe and a low concentration of polar reagent, at least one aliquot would include a high concentration of probe and a high concentration of polar reagent, and at least one aliquot would include a medium concentration of probe and a medium concentration of polar reagent (3-spectra screening analysis). In addition, further concentrations preferably can be selected in such a way that at least one aliquot includes a high concentration of probe and a low concentration of polar reagent and additionally, in a particularly preferred fashion, at least one aliquot includes a low concentration of probe and a high concentration of polar reagent (8-spectra analysis). Such a combination of concentrations ensures that the transport properties of the albumin are detected at different stages, namely, the physiological state during binding of hydrophobic compounds such as fatty acids (low concentration of probe and low concentration of polar reagent), the physiological state during transport of hydrophobic compounds through the vascular system (high concentration of probe and low concentration of polar reagent), and the physiological state during delivery (release) of hydrophobic compounds to the target cells (high concentration of probe and high concentration of polar reagent).

While according to SU 1319705 it is only possible to determine the binding coefficient of blood plasma or blood serum in the native state, and according to EP 0,973,043 A1, the concrete native state of albumin in the blood sample to be investigated is determined, the method according to the invention detects changes in the albumin conformation (conformational mobility) in their time profile under the influence of a polar reagent and thus, the albumin functionality and alteration of binding parameters of substrates to the albumin. Such changes are produced at a quite early stage e.g. by pathological processes such as carcinogenesis, by medical treatment, by drug abuse, or even during the steps of fractionating blood plasma components and during improper storage of plasma derivatives; according to the invention, it is possible to make distinct diagnostic statements even at an early stage of changes in the albumin functionality. Depending on the physicochemical characteristics of the medium used for ESR analysis, the albumin conformation in the blood samples and thus, the binding properties of a number of substrates on the albumin will be subject to changes.

Thus, the method of the invention is characterized in that changes in the transport properties of albumin (albumin functionality) e.g. in blood are determined with ESR spectroscopy by causing specific conformational changes on the albumin molecule, using different concentrations of polar reagent in the presence of different concentrations of spin probe. The ESR spectra recorded on the aliquots are simulated electronically using a mathematical model preferably based on a Hamilton function with axial anisotropy, the experimental and simulated spectra are compared, and the parameters of spin probe binding to specific spin probe binding sites on the albumin are determined electronically, preferably by minimizing the squares of the differences of the spectral values from the model and experimentally measured ESR spectra corresponding to these binding sites, the determined parameters of spin probe binding correlating with biophysical parameters of the albumin conformation and, depending on the physiological or pathological change to be diagnosed, specific parameters being selected from the determined parameters and, using these parameters, the cut-off values as a decision making criterion being calculated electronically using a discrimination function for the specific modification of the albumin conformation such as occurring during particular pathological or physiological changes.

According to the invention, a compound is used as spin probe which can undergo specific binding to the albumin, particularly fatty acids, steroid hormones or heterocyclic hydrocarbons which must be spin-labelled. Hydrophobic compounds labelled with nitroxyl radicals as well-known spin probes can also be used in the method of the invention. In a particularly preferred embodiment of the invention, spin-labelled fatty acids are used as spin probes, preferably doxylstearic acids. It is particularly preferred to use 16-, 5-, 7-, or 12-doxylstearic acid. Where spin-labelled fatty acids are used as spin probes, the parameters of spin probe binding at the binding sites 1, 2 and 3 of albumin can be determined.

An alcohol or DMSO is possible as polar reagent, and it is preferred to use a $C_1$–$C_6$ alcohol, with ethyl alcohol being particularly preferred.

In the meaning of the present invention, the sample containing albumin is understood to be e.g. a blood sample or a sample of a drug or product containing albumin.

According to the invention, the ESR spectra are recorded with at least three, preferably even up to eight spin probe concentrations. For example, three aliquots of a serum sample with a volume of 50 µl each are added with 16-doxylstearic acid at three different concentrations and with a polar reagent at three different volumes, so that the final concentration of spin probe in the aliquots to be investigated is $8.33 \cdot 10^{-4}$ mol/l, $1.55 \cdot 10^{-3}$ mol/l and $2.41 \cdot 10^{-3}$ mol/l, and the concentration of polar reagent is 2.90 mol/l, 3.37 mol/l and 3.80 mol/l (see Table 1). The incubation period is from 7 to 15 minutes, preferably 10 minutes. Incubation should proceed with agitation. As a rule, the ESR spectra are recorded at 37° C. and at the physiological pH value of blood. To increase the precision, the spectra can be recorded at two or more different temperature values of the samples ranging between 15 and 45° C. and/or at two or more different pH values of the serum samples ranging from 7.5 to 3.5.

Analysis of the measured ESR spectra is effected by electronic means using a specifically developed computer software for molecule mobility structural analysis (MMS). The ESR spectra recorded on the basis of said at least three, preferably eight aliquots of an albumin-containing sample, preferably a serum or plasma sample, are transferred to the computer software to calculate the parameters of spin probe binding at the different types of binding sites. The parameters of spin probe binding are analyzed on the basis of an ESR spectral simulation. An ESR spectral model, preferably based on a Hamilton function with axial anisotropy is used to simulate the ESR spectra obtained experimentally.

The parameters of spin probe binding in the albumin describe the simulation by minimizing the squares of the differences of the simulated ESR spectra and those obtained experimentally, such as those shown in EP 0,973,043 A1, for example.

The parameters are calculated separately for the different types of binding sites. The parameters characterizing the binding of the spin probe on the binding sites of the albumin molecule are calculated using ESR spectral simulation. A spin model, preferably based on the Hamilton function with axial anisotropy is used to calculate each component of the spectrum. The calculation is effected as described in EP 0,973,043 A1, page 4, bottom, to page 7, top.

The above-mentioned computer program which performs the calculation algorithm described is used in the mathematical processing of the ESR spectrum of the spin probe.

The time period for ESR spectrum processing is less than 15 seconds.

As result of the simulation calculation for each ESR spectrum, a value range of 48 spin probe parameters for the three albumin binding sites is obtained. Each of these parameters has a specific variance, corresponding to the state of the spin probe molecule bound to the albumin molecule, said state reflecting the conformational state of the albumin molecule. In that case where e.g. 16-doxylstearic acid is used as spin probe, a total of 17 parameters of Table 2 specifically characterizing the albumin conformational state are selected from the value range.

The set of 17 parameters according to Table 2 describes the state of the spin probe molecules bound to the binding sites of the albumin, which molecules, under the influence of the binding properties of the binding sites, reflect the actual conformational state of the albumin molecule in the form of biophysical parameters.

Using the determined set of 17 parameters, the spin probe distribution and mobility parameters for the individual aliquots are calculated according to Table 3, the distribution characteristics of the relative number of spin probe molecules $N_1$ to $N_3$ bound to the binding sites being calculated from the parameters of the relative spin probe concentration of the spin probe pool $C_1$ to $C_3$ by multiplying C1 to C3 with the concentration ratio of fatty acid (FS) to serum albumin (SA).

The mobility characteristics of the spin probe molecules immobilized on the albumin binding sites are calculated according to the formulas of Table 3, the polarity factors of the micro-environment of binding sites 1 and 2 being calculated from the isotropic constants of the HF structure $A_1$ and $A_2$, respectively. The orientation factors $S_1$ and $S_2$ are calculated from the isotropic constants of the HF structure $A_1$ and $A_2$, respectively, and from the respective anisotropy of the HF structure $\delta A_1$ and $\delta A_2$, respectively. The correlation times T'2 and T"2 are calculated from the width of the spectral lines $W_L$, $W_M$ and $W_H$.

The albumin binding parameters are preferably determined using the mathematical method of regression of the binding parameters of the spin probes in the aliquots as a function of the changes in the concentrations of spin probe and the concentrations of polar reagent. As binding characteristics of the albumin, a set of binding parameters of the aliquots consisting of $K_B$=binding constant, $N_1^0$=capacity of the fatty acid binding site 1, and $C_p$=critical concentration of polar reagent is calculated according to formula I using regression of the ratio of the relative number of spin probe molecules ($N_1$, $N_2$, $N_3$) bound to the fatty acid binding sites to the concentration of polar reagent (C):

$$N_3 = \frac{1}{K_B} \cdot \frac{C_p \cdot N_1}{(C_p - C) \cdot (N_1^0 - N_1)} \tag{I}$$

As further albumin binding parameters, the parameters for the individual aliquots $R_2$=ratio of the capacities of the fatty acid binding sites 2 to 1 in the native state of albumin, $K_2$=flexibility factor of the fatty acid binding site 2, $L_2$=limit of conformational stability of the albumin, are determined according to formula II using regression of the ratio of the relative number of spin probe molecules ($N_1$, $N_2$, $N_3$) bound to the fatty acid binding sites to the concentration of polar reagent (C):

$$N_2 = R_2 \cdot N_1 \cdot (1 + K_2 \cdot C \cdot (L_2 - N_1)) \tag{II}$$

Formulas (I) and (II) describe a model of the conformational flexibility of the system of the fatty acid binding sites of the albumin molecule which, according to the invention, has been developed on the basis of extensive experimental studies.

Using the set of calculated binding parameters of the albumin for the aliquots, the changes in the transport properties of the albumin are calculated according to Table 4, taking into account the test conditions used in the production of the aliquots. The test conditions to be used preferably permit calculation of the characteristics which determine the loading of the albumin with fatty acids ($K_L$, $N_L^0$—test condition: C=0, fatty acid/albumin quotient=0.5), the transport of fatty acids ($N_T^0$, $K_T$—test condition: C=0, fatty acid/albumin quotient=1.5), and the release of the fatty acids ($D_U$, $N_U^0$—test condition: C=3.37 M, fatty acid/albumin quotient=1.5). These characteristics are calculated according to the following formulas:

Integral binding constant=$K_L = K_B \cdot (N_1^0 + N_2^0)$,
Effective loading capacity=$N_L^0 = (N_1^0 + N_2^0)$,
Effective transport capacity=$N_T^0 = (N_1^0 + N_2^0)$,
Integral transport binding constant=$K_T = K_B \cdot (N_1^0 + N_2^0)$,
Dissociation constant=$D_U = 1/K_B$,
Effective release capacity=$N_U^0 = (N_1^0 + N_2^0)$.

According to the invention, the ESR method described can be used for diagnosing and/or monitoring physiological or pathological changes in a human or animal body, e.g. in early diagnosis of cancerous diseases. For the diagnosis of diseases or physiological changes, specific binding parameters from Table 2 are incorporated in a discrimination function for ESR screening analysis based on an evaluation of at least 3 aliquots with different concentrations of spin probe and polar reagent, so as to determine the cut-off values for the respective disease or pathological change to be diagnosed and compare these values with the cut-off values of reference samples.

Thus, in the diagnosis of cancerous diseases, for example, the parameters $D_i$ are determined according to Table 5. Indeed, one of the parameters $D_1$–$D_6$ is already sufficient to allow a reliable diagnosis. To further increase the reliability of the statements, it might be advantageous to determine additional parameters, particularly $D_2$, $D_3$, $D_5$, or $D_6$, or all of the six parameters $D_i$. If one of the parameters $D_i$>1, the albumin conformation is perturbed, and an oncologic disease is present, for example. If $D_i$<1, no oncologic disease is present in the subject.

The diagnostic precision of the diagnostic method of the invention has been tested on 212 patients suffering from a cancerous disease and 87 patients with no cancerous disease (cf., Table 6).

Table 6 demonstrates the high diagnostic precision of the ESR method according to the invention, being more than 90%. It is also possible to diagnose cancerous diseases at a quite early stage of the disease. Thus, even higher diagnostic precision is achieved when calculating the respective $D_2$, $D_3$, $D_5$, or $D_6$.

Thus, the ESR analysis of blood samples allows diagnosis of cancer and other diseases or physiological changes at a quite early stage of the disease. The modification of the transportation function of albumin is due to a blockage of the specific fatty acid binding sites of albumin, which already occurs at the beginning of a disease. Such blockage of binding results in globally perturbed albumin functions and binding properties for normal transport functions, but not for the support of neoplasms, which is one of the pre-conditions for growth of the latter. Blockage of the fatty acid binding sites results in substantial deficiencies in the supply of normal cells and in immune system disorders. Such changes are not covered by parameters which can be determined by current methods of clinical-chemical routine diagnostics; initial responses of the organism to tumor development can only be detected by using the ESR method according to the invention.

The method of the invention can be used both as an in-process control parameter in the production of albumin-containing drugs and for the determination and control of the quality of albumin-containing preparations, preferably blood or plasma preparations, by comparing the changes of the albumin transport properties determined according to the invention with the transport properties of the starting material and/or native serum albumin of healthy subjects.

The use of the method according to the invention also includes uses to determine the effectiveness of various procedures to purify albumin from ligands bound to the molecule and methods such as hemosorption and hemodialysis to remove endotoxins affecting the binding characteristics and transport properties of the albumin, said uses involving comparison of the starting material with the purified albumin-containing material.

The method of the invention is effective in terms of cost and time, allowing automated determination of various ESR spectra. The result of each screening test for 3 aliquots is furnished within less than 10 minutes, and a complex ESR analysis of 8 aliquots requires about 24 minutes.

The invention is also directed to a test kit for performing the method of the invention, said kit including a microtiter plate with said fixed, stabilized and precisely dosed, different concentrations of spin probe and polar reagent required. It is possible that the test kit merely comprises the precisely dosed amounts of spin probe and polar reagent in separate containers, e.g. sealed test tubes, so that the pre-dosed amounts merely have to be added to the aliquots of the sample to be investigated in the laboratory.

In addition, the invention is directed to an ESR spectrometer for performing the method of the invention and to a method of achieving high precision, stability and sensitivity when recording the ESR spectra. The inventive ESR spectrometer, being an automated ESR analyzer, allows for simple and reliable handling, as required in modern clinical laboratories, by integrating automatic device control, signal registration and signal evaluation in combination with a computer program for the diagnostic analysis of the measured data.

Figure 1:
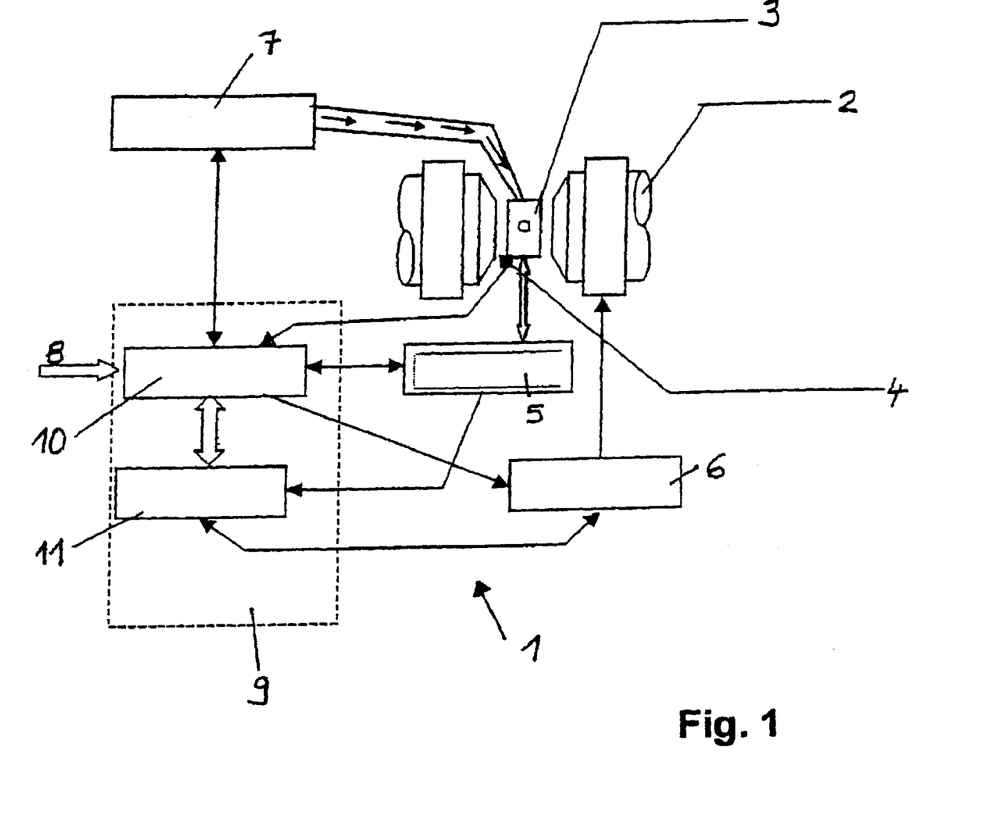
FIG. 1—diagram of ESR spectrometer.

According to the representation in FIG. 1, the ESR spectrometer 1 for performing the method of the invention is comprised of a shielded compact electromagnet with Hall stabilization system 2, a measuring resonator 3 coupled with a homodyne UHF unit 5, a device control and signal registration unit 9, and a system of thermostat control 7 for the samples to be investigated.

The device control and signal registration unit 9 is comprised of two single-chip computers (not depicted), one of which serving as system controller 10 for automated tuning and stabilization, while the second one, used as ESR signal processor 11, generates the spectral scan algorithm, and accumulates, digitally filters and records the signal data.

To record the ESR spectra, the sample to be investigated is placed in the measuring chamber of the resonator 3 wherein the main oscillator of the UHF unit 5 emits the UHF waves. The ESR signal is measured using a homodyne waveguide unit as source of UHF radiation which is reflected by the measuring resonator 3.

The magnetic field required to excite the ESR signal is generated by the electromagnet 2. The voltage source 6 of electromagnet 2 is controlled by an ESR signal processor 11.

The UHF unit 5 is controlled by the device control unit 10 which ensures frequency fine tuning of the measuring resonator 3 with the main oscillator of the UHF unit 5, monitors the thermostat control 7 of the sample to be investigated, and couples the ESR spectrometer 1 to the operator's personal computer 8 which is used for spectrometer control and data analysis.

In contrast to familiar ESR spectrometers including only one tuning element either for generator or resonance frequency tuning, wherein tuning over a large frequency range is effected by generator tuning only, while resonator tuning controls just a small frequency range, yet ensures a stable frequency when measuring different samples, the inventive spectrometer is equipped with two control devices, one to control the generator frequency, and a second one for the resonance frequency. On the one hand, this is necessary to allow a wide range of uses to investigate different and diverse samples and, at the same time, allow for the necessarily required congruence and reproducibility of the characteristics of the ESR spectra when investigating aliquot samples according to the method of the invention.

One of the control devices is installed on the main oscillator of the UHF unit 5 to tune the frequency in the range of 200–400, preferably 300 MHz of the central frequency of 9.45±0.5 GHz. The second control device is installed on the measuring resonator 3 to tune the resonance frequency in the range of 10–50, preferably 30 MHz, using resonator cavity volume variation by means of a motor-driven traction rod.

Trimming of the main oscillator of UHF unit 5 subsequent to changing the samples to be investigated is effected only in case the range of resonance frequency tuning is insufficient. This is done in case the type of sample to be investigated changes or in that case where the sample preparation procedure is changed substantially.

Thus, if a set of samples of the same type is investigated, the spectra thereof will be recorded virtually at one single UHF frequency. In this event, the base (background) spectral line is identical for all spectra recorded, which is very important for the precision of subsequent calculation of the characteristics of the objects under investigation.

The thermostat control system 7 is used to stabilize the sample temperature in a range of from 30° C. to 45° C. with high precision.

In contrast to the familiar ESR spectrometers, this system 7 includes an additional subsystem in the form of an additional control loop (not depicted). The general control loop of the thermostat control system 7 is comprised of a heat-controlled stream of air which, depending on the requirements, blows pre-heated or pre-cooled air into the resonator chamber to control the temperature of the sample vial.

The additional control loop of the thermostat control system 7 serves to increase the precision of sample temperature stabilization by minimizing the gradient within the resonator chamber. To this end, the resonator body 3 is heated to the actual sample temperature using self-heating of the magnet as a result of the heat radiation thereof, the temperature of the resonator body 3 being measured by means of a temperature sensor 4. During the interruptions of spectrum recording, the voltage source 6 of the electromagnet 2 is switched to higher or lower values.

The structure and huge mass of the shielded compact electromagnet 2 additionally protect the thermal insulation of the resonator 3 against environmental influence.

To analyze the ESR spectra by means of ESR spectral simulation according to the method of the invention, it is necessary—in contrast to familiar spectrometers—to develop a special procedure of digital filtering so as to ensure recording of a precise form of the spectra for the calculation of spectral parameters by means of simulation, because—in contrast to familiar methods—the correlations in the measured signal occurring during filtering of signal noise and pulse interference or due to noise suppression have to be minimized in order to be capable of using the inventive spectrometer in the method of the invention by ensuring the required high precision of ESR spectral recording, as well as stability and sensitivity of the spectrometer.

To this end, the ESR signal processor generates an algorithm of spectral scanning by controlling the voltage source.

The readings of the ESR signal from the UHF unit 5 are transformed by an A/D converter at a frequency of 10 kHz and accumulated in the memory of signal processor 11.

Because the typical spectrum scanning time is more than one minute and the number of spectral dots is less than 10,000, each spectral dot will be developed from 60 or more signal readings.

Irrespective thereof, a certain part of the accumulated spectral readings is usually false because the ESR spectrometer is an ultra-sensitive instrument that might respond to electromagnetic interference or mechanical vibrations.

In contrast to familiar ESR spectrometers, high sensitivity and stability of the inventive ESR spectrometer is achieved by employing a specific algorithm to calculate each spectral dot, wherein N recordings of the ESR signal $S_i$ accumulated for each spectral dot are summed with the specific weighting factors $k_i$. These factors are inversely proportional to the squares of the measurement errors of the corresponding recordings.

The error $\Delta_i$ of the ith signal reading is calculated as the difference between this reading $S_i$ and the arithmetic mean of the other (N−1) readings:

$$\Delta_i = \frac{1}{N-1}(\sum_{p=1}^{N} S_p - S_i) - S_i$$

$$k_i = \frac{1}{(\Delta_i)^2} = (N-1)^2 / (\sum_{p=1}^{N} S_p - S_i \cdot N)^2$$

The resulting expression for calculating the signal dot is $$S = (\sum_{i=1}^{N} k_i \cdot S_i) / (\sum_{i=1}^{N} k_i)$$

If the reading $S_i$ includes pulse noise, the error value $\Delta_i$ is increased (e.g. tenfold), and the corresponding weighting factors $k_i$ are reduced by a multiple (e.g. hundredfold). As a result, and in contrast to familiar ESR spectrometers, readings including pulse noise are excluded from the recording of spectral information in the inventive ESR spectrometer. This algorithm is used in the accumulation of each measured dot of the spectrum.

As a result, high sensitivity and stability of the recorded ESR spectrum is ensured. At the same time, the generation of an additional correlation between neighboring spectral dots is prevented, which in familiar methods of filtering ESR signals represents a major cause of loss of precision when determining spectral parameters by means of spectral simulation.

The ESR spectra obtained are analyzed using a special ESR software (MMS), the program for ESR screening analysis generating a measuring algorithm to measure 3 aliquots, implementing the results in accordance with the protocol for evaluation using the discrimination functions according to Table 5.

To carry out the complex ESR analysis, the program generates a measuring algorithm for from 5 to preferably 8 aliquots, the results of which being implemented with reference to the protocol for the determination of the albumin transport properties using the mathematical regression method.

The program ensures facile automated execution of sample measurement and evaluation without requiring special training or qualification of the measuring personnel.

With reference to the examples, the invention will be illustrated in more detail below.

EXAMPLE 1

Examination of Patients Suffering from Oncologic Diseases and of Healthy Patients Using ESR Screening Analysis (3-Spectra Analysis)

Blood serum is obtained by whole blood centrifugation, and the serum samples are divided into three aliquots. These serum samples of 50 μl each are added with 10, 12 and 14 μl of an alcoholic spin probe solution (spin probe concentration $8.33 \cdot 10^{-4}$ mol/l, $1.55 \cdot 10^{-3}$ mol/l and $2.41 \cdot 10^{-3}$ mol/l). The prepared mixtures are incubated for 10 min at 37° C. with continuous agitation.

Following incubation of the prepared samples, the samples are transferred into three capillaries. For each capillary, the ESR spectra are recorded in the resonator of the ESR spectrometer at a constant temperature of 37±0.2° C.

Each recorded ESR spectrum is a superposition of the specific spectrum of the spin probe molecules immobilized on different binding sites, which is specific for long-chain fatty acids. These binding sites are situated on the serum albumin of the blood serum under investigation.

The three recorded ESR spectra are loaded in a computer to calculate the parameters of spin probe binding. This analysis is carried out separately for each binding site, using the above-described method of ESR spectral simulation.

Figure 2:
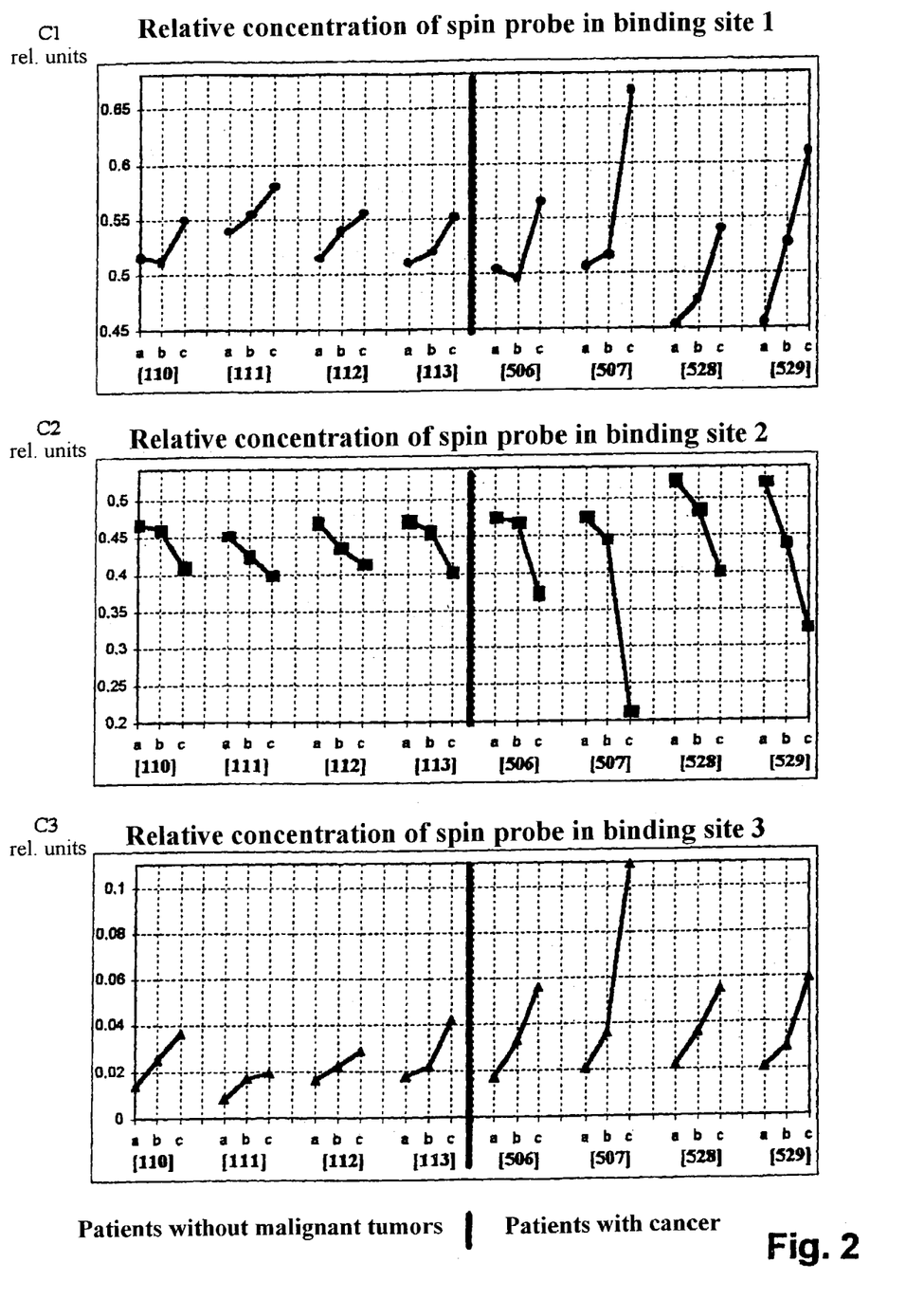
FIG. 2—examples relating to the determination of the (16-DS) spin probe parameters in serum albumin of several patients with and without carcinomas.

Table 7 and FIG. 2 include examples relating to the determination of the (16-DS) spin probe parameters in serum albumin of several patients with and without carcinomas.

I. Patients with Cancerous Disease $1^{st}$ patient, study code 506.
  Clinical diagnosis: esophagus carcinoma.
$2^{nd}$ patient, study code 507.
  Clinical diagnosis: stomach carcinoma.
$3^{rd}$ patient, study code 528.
  Clinical diagnosis: mammary carcinoma.
$4^{th}$ patient, study code 529.
  Clinical diagnosis: lung carcinoma.

II. Patients with no Cancerous Disease $1^{st}$ patient, study code 110, aged 42.
Clinical diagnosis: diffuse mastopathy. No histological evidence of cancer.

$2^{nd}$ patient, study code 111, aged 23.
Clinical diagnosis: healthy general condition.

$3^{rd}$ patient, study code 112, aged 22.
Clinical diagnosis: healthy general condition.

$4^{th}$ patient, study code 113, aged 40.
Clinical diagnosis: rheumatic heart disease.

Table 7 and FIG. 2 demonstrate that the measured binding parameters of the spin probes for cancer patients and for patients with no evidence of cancer differ only at elevated alcohol concentrations of polar reagent (serum samples B and C). These differences indicate a specific modification of the conformational mobility of the serum molecules in the blood samples of patients suffering from cancerous diseases.

EXAMPLE 2

Complex ESR Spectral Analysis (3- and 8-Spectra Analysis) of the Albumin Transport Function in Native Serum of a Healthy Population (Females and Males)

Each serum sample was mixed with a volume of 50 µl including 3, respectively 8 different concentrations of 16-doxylstearic acid spin probe (dissolved in ethyl alcohol), resulting in spin probe final concentrations of from $0.83 \cdot 10^{-3}$ mol/l to $2.34 \cdot 10^{-3}$ mol/l, and ethyl alcohol final concentrations of from 1.86 mol/l to 3.8 mol/l. The pH values of the serum samples after mixing with the spin probes were 7.4±0.05. The prepared mixtures were incubated for 10 min at 37° C. with continuous agitation and, subsequent to incubation, transferred into glass capillaries for ESR spectrum recording and analysis. The spectra were recorded in the ESR spectrometer of the invention. The ESR spectra for each capillary were recorded in the resonator of the ESR spectrometer at a constant temperature of 37±0.2° C. For all of the recorded ESR spectra (3 and 8 spectra) of each sample, the parameters of spin probe binding are calculated in the integrated ESR analyzer, using the computer software according to the invention. An ESR spectral model (Hamilton function with axial anisotropy) is used to simulate the experimentally obtained ESR spectra of various spin probes. The parameters of spin probe binding in the serum albumin describe the simulation by minimizing the squares of the differences between the simulated ESR spectra and those obtained by experiment. The analysis is performed separately for each binding site, the computer program furnishing the ESR parameters to characterize the albumin functionality and conformation.

The parameters of the albumin transport function in native serum from healthy donors of blood and plasma are listed in Table 8 as an example of intact albumin transport functions. Using the complex ESR spectral analysis, no anomalies can be detected in the serum samples of these healthy donors.

EXAMPLE 3

Expanded ESR Spectral Analysis (3-Spectra and 3D Analysis) of the Albumin Transport Function in Native Serum of Patients with Hematologic Systemic Diseases (Hemoblastosis, Chronic Lymphatic Leukosis (CML), Plasmocytoma)

Blood serum is obtained by whole blood centrifugation, and the serum samples are divided into three aliquots. These serum samples of 50 µl each are added with 10, 12 and 14 µl of an alcoholic spin probe solution (spin probe concentration $0.83 \cdot 10^{-3}$ mol/l, $1.61 \cdot 10^{-3}$ mol/l and $2.43 \cdot 10^{-3}$ mol/l). The prepared mixtures are incubated for 10 min at 37° C. with continuous agitation.

Following incubation of the prepared samples, the samples are transferred into three capillaries. For each capillary, the ESR spectra are recorded in the resonator of the inventive ESR spectrometer at a constant temperature of 37±0.2° C. The three recorded ESR spectra are loaded in a computer to calculate the parameters of spin probe binding. This analysis is carried out separately for each binding site, using the above-described method of ESR spectral simulation by means of the computer software according to the invention.

Malignant hematologic systemic diseases can be detected by the ESR screening. Table 9 illustrates the discrimination parameters of the serum samples of 5 patients with CML and 3 patients with plasmocytomas. The discrimination functions $D_1$–$D_5$ provide a typical picture of the presence of carcinoma which is also reflected by the 3D analysis of the fatty acid binding sites.

EXAMPLE 4

Expanded ESR spectral Analysis (3-Spectra and 3D Analysis) of the Albumin Transport Function of Albumin-Containing Drug Samples for Quality Control Samples of the albumin-containing drugs (albumin solutions, frozen fresh plasma) were mixed with a volume of 50 µl of 3, respectively 8 different concentrations of 16-doxylstearic acid spin probe (dissolved in ethyl alcohol), resulting in spin probe final concentrations of from $0.83 \cdot 10^{-3}$ mol/l to $2.34 \cdot 10^{-3}$ mol/l, and ethyl alcohol final concentrations of from 1.86 mol/l to 3.8 mol/l. The pH value of the serum samples after mixing with the spin probes was 7.4±0.05. The prepared mixtures were incubated for 10 min at 37° C. with continuous agitation and, subsequent to incubation, transferred into glass capillaries for ESR spectrum recording and analysis. The spectra were recorded in the ESR spectrometer of the invention. The ESR spectra for each capillary were recorded in the resonator of the ESR spectrometer at a constant temperature of 37±0.2° C. For all of the recorded ESR spectra (3 and 8 spectra) of each aliquot, the parameters of spin probe binding are calculated in the integrated ESR analyzer, using the computer software according to the invention. An ESR spectral model (Hamilton function with axial anisotropy) is used to simulate the experimentally obtained ESR spectra of various spin probes. The parameters of spin probe binding in the serum albumin describe the simulation by minimizing the squares of the differences between the simulated ESR spectra and those obtained by experiment. The analysis is performed separately for each binding site, the computer program furnishing the ESR parameters to characterize the albumin functionality and conformation.

The expanded ESR spectral analysis (3-spectra and 3D analysis) of the albumin transport function is suitable for the quality and in-process control in the production of drugs containing albumin. Tables 10 and 11 show the in-process use of the ESR technology in 3- and 8-spectra analysis for plasma products (Table 10) obtained in different ways (whole blood plasma vs. plasmapheresis) and treated differently (filtered=leukocyte-depleted), and for intact and denatured albumin (Table 11). Apparently, it is possible to assess the capacity of the albumin transport function of the final products (e.g. albumin solutions, frozen fresh plasma for transfusion), but also, to analyze particular sections of the production process with respect to their effect on the qualitative albumin transport properties.

TABLE 1

Preferred concentrations of spin probe (16-doxylstearic acid) and polar reagent (ethyl alcohol)

| Designation of aliquots | Final concentrations C spin probe/ C albumin | Final concentrations of spin probe, $10^{-3}$M for serum albumin* | Final concentrations of polar reagent, M** |
|---|---|---|---|
| 1. ESR screening analysis | | | |
| A | 1.6500 | 0.83 | 2.90 |
| B | 3.2870 | 1.61 | 3.37 |
| C | 4.9430 | 2.34 | 3.80 |
| 2. Complex ESR spectral analysis | | | |
| A | 1.6500 | 0.83 | 2.90 |
| B | 3.2870 | 1.61 | 3.37 |
| C | 4.9430 | 2.34 | 3.80 |
| D | 2.3100 | 1.09 | 3.80 |
| E | 3.8346 | 1.82 | 3.80 |
| F | 3.2868 | 0.89 | 1.86 |
| G | 4.9434 | 1.31 | 2.14 |
| H | 5.0440 | 1.78 | 2.90 |//
| To plot the graphic representations, a point (P0) with the final concentrations | | | |
| P0 | 1.6500 | 0.45 | 1.58 |
| is set by the program. | | | |

Figure 3:
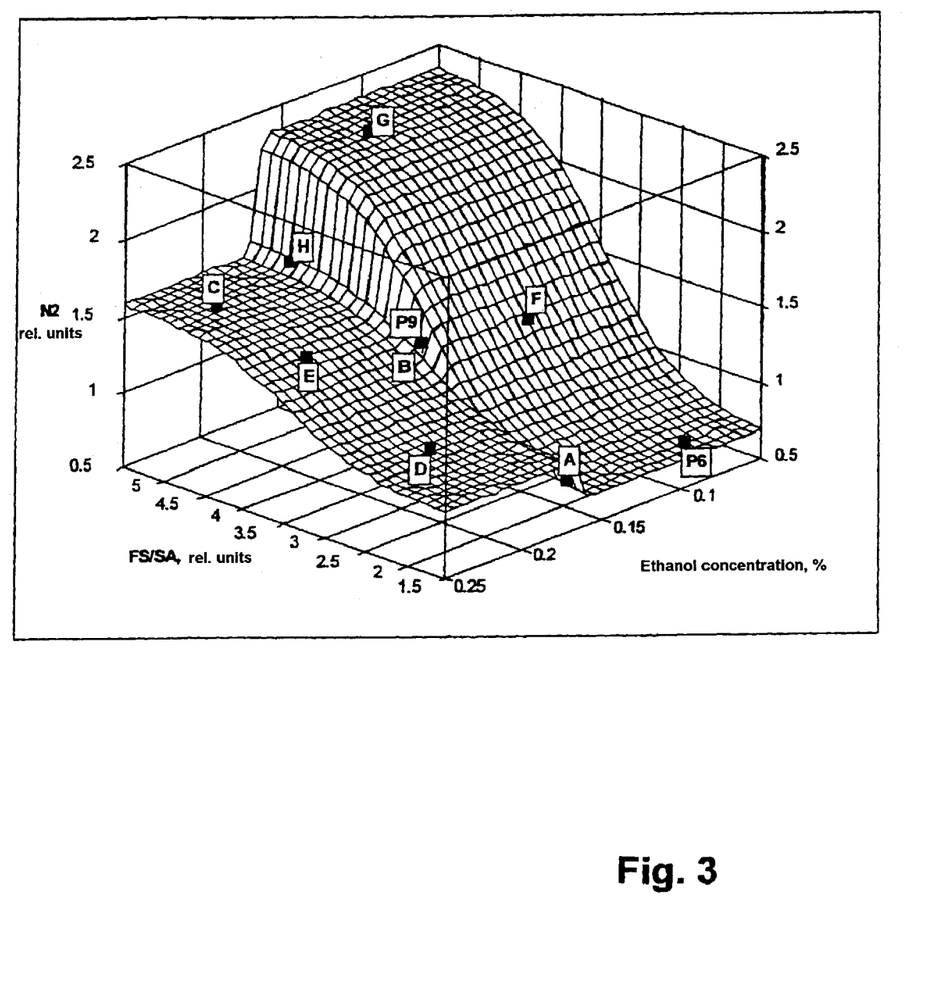
FIG. 3—matrix of the concentration distribution of the aliquots.

P0 = experimental limit value of the native conformation of albumin
*= C albumin for serum or plasma, physiological, 35–45 g/l
**= values for polar reagent ethyl alcohol The matrix of the concentration distribution of the aliquots (Example—rel. number of spin probe molecules in BS-2) is illustrated in FIG. 3.

TABLE 2

16-DS spin probe parameters determined from ESR spectra and their correlation with a characteristic of the albumin conformation and functionality.

| Parameters of spin probe binding | Unit | Design. | Xi | Biophysical characteristics |
|---|---|---|---|---|
| First component of spectrum | | | | Binding site 1 |
| 1. Relative spin probe concentration | rel. units | $C_1$ | 0.6 | Specific capacity of binding site |
| 2. Isotropic g factor | rel. units | $g_{01}$ | 2.0 | Integral characteristics of binding site conformation |
| 3. Degree of g factor anisotropy | rel. units | $\delta g_1$ | $-6.10E^{-04}$ | Characteristics of micro-environment of spin probe on binding site |
| 4. Isotropic HFS constant | mT | $A_1$ | 1.62 | Characteristics of size of binding site (inverse proportion) |
| 5. Degree of HFS anisotropy | rel. units | $\delta A_1$ | 1.27 | Degree of spin probe orientation |
| 6. Width of low-field spectral line | mT | $W_{L1}$ | 0.28 | Characteristics of spin probe mobility |
| 7. Width of central spectral line | mT | $W_{M1}$ | 0.27 | Characteristics of spin probe mobility |
| 8. Width of high-field spectral line | mT | $W_{H1}$ | 0.31 | Characteristics of spin probe mobility |
| Second component of spectrum | | | | Binding site 2 |
| 9. Relative spin probe concentration | rel. units | $C_2$ | 0.39 | Specific capacity of binding site |
| 10. Isotropic g factor | rel. units | $g_{02}$ | 2.0 | Integral characteristics of binding site conformation |
| 11. Degree of g factor anisotropy | rel. units | $\delta g_2$ | $8.30E^{-05}$ | Characteristics of micro-environment of spin probe on binding site |
| 12. Isotropic HFS constant | mT | $A_2$ | 1.47 | Characteristics of size of binding site (inverse proportion) |
| 13. Degree of HFS anisotropy | rel. units | $\delta A_2$ | $-0.12$ | Degree of spin probe orientation |
| 14. Width of low-field spectral line | mT | $W_{L2}$ | 0.44 | Characteristics of spin probe mobility |
| 15. Width of central spectral line | mT | $W_{M2}$ | 0.32 | Characteristics of spin probe mobility |

TABLE 2-continued

16-DS spin probe parameters determined from ESR spectra and their correlation with a characteristic of the albumin conformation and functionality.

| Parameters of spin probe binding | Unit | Design. | Xi | Biophysical characteristics |
|---|---|---|---|---|
| 16. Width of high-field spectral line | mT | $W_{H2}$ | 0.74 | Characteristics of spin probe mobility |
| Third component of spectrum* | | | | Binding site 3 |
| 17. Relative spin probe concentration | rel. units | $C_3$ | $9.7E^{-03}$ | Specific capacity of binding site |

*Note:
The third component of the spectrum corresponds to the spin probes on binding sites of low affinity and therefore, their further characteristics are insignificant.

TABLE 3

Calculation of parameters of spin probe distribution and mobility

| ESR-spectral parameters | Distribution characteristics |
|---|---|
| Relative concentrations of spin probe pool | Relative number of spin probe molecules bound on binding sites |
| Spectral components | Binding site |
| 1  $C_1$ → | 1  $N_1 = FS/SA\ C_1$ |
| 2  $C_2$ → | 2  $N_2 = FS/SA\ C_2$ |
| 3  $C_3$ → | 3  $N_3 = FS/SA\ C_3$ |
|  | Mobility characteristics |
| Isotropic constants of HF structure | Polarity factors of micro-environment |
| 1  $A_1$ → | 1  $P_1 = \dfrac{A^0_{XX} + A^0_{YY} + A^0_{ZZ}}{3 \cdot A_1}$ |
| 2  $A_2$ → | 2  $P_2 = \dfrac{A^0_{XX} + A^0_{YY} + A^0_{ZZ}}{3 \cdot A_2}$ |
| Anisotropy of HF structure | Orientation factors |
| 1  $\Gamma_{A_1}$ → | 1  $S_1 = \dfrac{\delta A_1 \cdot A_1 + 1.5 \cdot \left(\dfrac{1.1 \cdot 10^{-7}}{\tau}\right)^{2/3}}{A^0_{ZZ} - \dfrac{1}{2} \cdot (A^0_{XX} + A^0_{YY})} \cdot \dfrac{1}{P_1}$ |
| 2  $\Gamma_{A_2}$ → | 2  $S_2 = \dfrac{\delta A_2 \cdot A_2 + 1.5 \cdot \left(\dfrac{1.1 \cdot 10^{-7}}{\tau}\right)^{2/3}}{A^0_{ZZ} - \dfrac{1}{2} \cdot (A^0_{XX} + A^0_{YY})} \cdot \dfrac{1}{P_2}$ |
| Width of spectral lines | Correlation time |
| 2  $W_L$ | 2  $T'_2 = 6.5 \cdot 10^{-10} \cdot W_M \cdot \left(\dfrac{W_H}{W_M} + \dfrac{W_L}{W_M} - 2\right)$ |
| 2  $W_M$ | |
| 2  $W_H$ | 2  $T''_2 = 6.65 \cdot 10^{-10} \cdot W_M \cdot \left(\dfrac{W_H}{W_L} - 1\right)$ |

$A^0_{XX} = 0.59$ mT
$A^0_{YY} = 0.54$ mT     Known constants for
$A^0_{ZZ} = 3.29$ mT     nitroxide FS spin labels
$t = 35 \times 10^{-n}$ s

TABLE 4

Determination of parameters of the transport properties of albumin

| Characteristics of FS binding site flexibility |
|---|
| Functional dependence of binding parameters |
| • Binding constant $Kb = B \cdot (Cp - Calc) \cdot 10^7$ |
| • Effective capacity of BS 1     $N_1^0$ |
| • Effective capacity of BS 2 $N_2^0 = R_2 \cdot (1 - K_2 \cdot Calc \cdot (L_2 - N_1)) \cdot N_1^0$ |

| Characteristics - loading with fatty acids | |
|---|---|
| Test conditions: (physiologically normal) | Calc = 0 <br> FS/SA = 0, 5 |
| • Integral binding constant <br> determines effectiveness of adsorption by albumin | $K_L = Kb \cdot (N_1^0 + N_2^0)$ |
| • Effective capacity <br> determines the effective capacity for loading | $N_L^0 = (N_1^0 + N_2^0)$ |

| Characteristics - transport of fatty acids | |
|---|---|
| Test conditions: (physiologically normal) | Calc = 0 <br> FS/SA = 1, 5 |
| • Effective capacity <br> determines the effective capacity for transport in the vascular system | $N_T^0 = (N_1^0 + N_2^0)$ |
| • Integral binding constant <br> determines the fixation during transport in the vascular system | $K_T = K_b \cdot (N_1^0 + N_2^0)$ |

| Characteristics - release of fatty acids | |
|---|---|
| Test conditions: (stimulation of albumin conformational change) | Calc = 3,37 M <br> FS/SA = 1, 5 |
| • Dissociation constant <br> determines the effective of dissociation | $D_U = 1/Kb$ |
| • Effective capacity <br> determines the capacity of SA for metabolite absorption | $N_U^0 = (N_1^0 + N_1^0)$ |

TABLE 5

Examples of discrimination functions

| Definition* $D_i$ | Description of the parameters |
|---|---|
| $D_1 = K_1 \cdot (|y_2 - y_1| + |y_3 - y_2|)$, wherein $y_1 = C1(A)$, $y_2 = C1(B)$, $y_3 = C1(C)$ | Three parameters of the relative spin probe concentration in binding site 1 of serum albumin from three serum samples A, B and C |
| $D_2 = K_2 \cdot (y_3 - y_1 - 0.5)$, wherein $y_1 = C2(A)$, $y_3 = C2(C)$ | Two parameters of the relative spin probe concentration in binding site 2 of serum albumin from serum samples A and C |
| $D_3 = K_3 \cdot (|y_2 - y_1| + |y_3 - y_2|)$, wherein $y_1 = C2(A)$, $y_2 = C2(B)$, $y_3 = C2(C)$ | Three parameters of the relative spin probe concentration in binding site 2 of serum albumin from three serum samples A, B and C |
| $D_4 = K_4 \cdot (C3(C) - C3(A) + 0.5)$ | Two parameters of the relative spin probe concentration in binding site 3 of serum albumin from serum samples A and C |
| $D_5 = K_5 \cdot (|C1(C) - C1(A)| + |C2(C) - C2(A)| + |C3(C) - C3(A)|)$ | Six parameters of the relative spin probe concentration in different binding sites of serum albumin from serum samples A and C |
| $D_6 = 2 - P_2(C) \cdot K_6$ | Polarity factor of the spin probe environment in fatty acid binding site 2 of serum sample C |

The parameters C1, C2 and C3 are the values of the relative spin probe concentration in the respective binding sites 1, 2 and 3. The polarity factor $P_2$ is calculated using $P_2 = 1.47333/A_2$ (mT), wherein $A_2$ represents the isotropic HFS constant of fatty acid binding site 2. The symbols A, B and C designate the sample numbers within a series of measured serum samples of a blood sample under investigation as follows:
A serum sample with a spin probe final concentration of $8.33 \cdot 10^{-4}$ mol/l,
B serum sample with a spin probe final concentration of $1.61 \cdot 10^{-4}$ mol/l,
C serum sample with a spin probe final concentration of $2.34 \cdot 10^{-4}$ mol/l.

The coefficients $K_1$ to $K_5$ depend on the actual concentrations of the reactive species used and on the result of expanding and substantiating the data relating to the parameters of serum albumin of a highest possible number of cancer patients and healthy subjects.

The coefficients $K_1$ to $K_5$ may have values such as:

$K_1 = 7.843$; $K_2 = 1.517$; $K_3 = 6.3$; $K_4 = 1.881$; $K_5 = 3.009$; $K_6 = 1.002$.

TABLE 6

Diagnostic precision of tests based on discrimination functions in the result of a clinical study on 212 patients with cancerous diseases (stomach, esophagus, rectal, liver, lung, breast, prostate carcinoma) and 87 patients with no cancerous disease

| Discrimination functions | Sensitivity of diagnosis, % | Specificity of diagnosis, % | Precision of diagnosis, % |
|---|---|---|---|
| $D_1$ | 92.3 ± 7.4 | 92.3 ± 7.4 | 92.3 ± 7.4 |
| $D_2$ | 96.0 ± 4.0 | 92.3 ± 7.4 | 95.0 ± 5.0 |
| $D_3$ | 96.0 ± 4.0 | 96.0 ± 4.0 | 96.0 ± 4.0 |
| $D_4$ | 96.0 ± 4.0 | 84.6 ± 10.0 | 90.3 ± 7.1 |
| $D_5$ | 96.0 ± 4.0 | 92.3 ± 7.4 | 94.2 ± 5.2 |

TABLE 7

Binding parameters of spin probes in specific binding sites of albumin from patients with and without cancerous disease as specified in the Examples and in Table 3.

Binding parameters* of spin probe in the 3 albumin binding sites

| Study code | Serum sample A | | | Serum sample B | | | Serum sample C | | |
|---|---|---|---|---|---|---|---|---|---|
| | C1 | C2 | C3 | C1 | C2 | C3 | C1 | C2 | C3 |
| Patients with cancer | | | | | | | | | |
| 506 | 0.504 | 0.476 | 0.0171 | 0.495 | 0.468 | 0.0328 | 0.564 | 0.373 | 0.0561 |
| 507 | 0.506 | 0.474 | 0.0202 | 0.516 | 0.444 | 0.0359 | 0.665 | 0.212 | 0.1092 |
| 528 | 0.453 | 0.524 | 0.0218 | 0.475 | 0.485 | 0.0357 | 0.539 | 0.401 | 0.0545 |
| 529 | 0.457 | 0.521 | 0.0203 | 0.528 | 0.438 | 0.0295 | 0.609 | 0.324 | 0.0596 |
| Patients void of malignant tumors | | | | | | | | | |
| 110 | 0.517 | 0.469 | 0.0135 | 0.512 | 0.461 | 0.0251 | 0.549 | 0.409 | 0.0369 |
| 111 | 0.539 | 0.451 | 0.0083 | 0.555 | 0.425 | 0.0168 | 0.579 | 0.398 | 0.0193 |
| 112 | 0.514 | 0.469 | 0.0161 | 0.541 | 0.435 | 0.0222 | 0.556 | 0.412 | 0.0287 |
| 113 | 0.510 | 0.471 | 0.0175 | 0.519 | 0.456 | 0.0215 | 0.551 | 0.401 | 0.0421 |

*For each examined patient, the illustrated parameters were determined by ESR analysis of three serum samples designated A, B, C. Each sample A, B and C was mixed with 10 µl, 12 µl and 14 µl alcoholic solution of the spin probe (spin probe final concentration $8.33 \cdot 10^{-4}$ mol/l, $1.55 \cdot 10^{-3}$ mol/l, $2.41 \cdot 10^{-3}$ mol/l.
The illustrated parameters describe:
C1 Relative spin probe concentration in binding site 1;
C2 Relative spin probe concentration in binding site 2;
C3 Relative spin probe concentration in binding site 3.

TABLE 8

ESR parameters of healthy persons (16 males, 18 females).

| Parameter | Unit | Number | Mean value | SD |
|---|---|---|---|---|
| Screening parameters of the albumin functionality | | | | |
| D1 | Rel. units | 32 | 0.617 | 0.076 |
| D2 | Rel. units | 32 | 0.892 | 0.023 |
| D3 | Rel. units | 32 | 0.663 | 0.089 |
| D4 | Rel. units | 32 | 0.956 | 0.002 |
| D5 | Rel. units | 32 | 0.487 | 0.073 |
| Physicochemical characteristics of the fatty acid binding sites | | | | |
| $K_B$ | $10^7$ M | 32 | 8.44 | 0.46 |
| $N_1^0$ | Rel. units | 32 | 10.32 | 0.11 |
| $R_2$ | Rel. units | 32 | 0.87 | 0.02 |
| $C_P$ | Rel. units | 32 | 0.30 | 0.00 |
| $K_2$ | Rel. units | 32 | 1.49 | 0.11 |
| $L_2$ | Rel. units | 32 | 2.43 | 0.12 |
| Factors of albumin transport, loading and release | | | | |
| $N_1^0$ | Rel. units | 32 | 10.32 | 0.11 |
| $N_T^0$ | Rel. units | 32 | 19.32 | 0.36 |
| $N_L^0$ | Rel. units | 32 | 19.32 | 0.36 |
| $N_U^0$ | Rel. units | 32 | 22.24 | 0.27 |
| $K_T$ | $10^7$ M | 32 | 150.44 | 6.95 |
| $K_L$ | $10^7$ M | 32 | 150.44 | 6.95 |
| $D_U$ | $10^7$ M$^{-1}$ | 32 | 0.06 | 0.00 |

TABLE 9

Screening parameters of the albumin functionality

| Parameter | Unit | CLL | | | Plasmocytoma | | |
|---|---|---|---|---|---|---|---|
| | | Number | Mean value | SD | Number | Mean value | SD |
| D1 | Rel. units | 5 | 1.134 | 0.218 | 3 | 1.424 | 0.414 |
| D2 | Rel. units | 5 | 1.030 | 0.033 | 3 | 1.096 | 0.085 |
| D3 | Rel. units | 5 | 1.127 | 0.138 | 3 | 1.402 | 0.3521 |
| D4 | Rel. units | 5 | 0.980 | 0.025 | 3 | 1.006 | 0.007 |
| D5 | Rel. units | 5 | 1.219 | 0.165 | 3 | 1.320 | 0.337 |

TABLE 10

Parameters of plasma products (frozen fresh plasma) obtained and treated differently

| Parameter | Unit | Whole blood plasma | | | Plasmapheresis | | | Filtrated plasma | | |
|---|---|---|---|---|---|---|---|---|---|---|
| | | Number | Mean value | SD | Number | Mean value | SD | Number | Mean value | SD |
| Screening parameters of the albumin functionality | | | | | | | | | | |
| D1 | Rel. unit | 21 | 1.40 | 0.24 | 10 | 2.58 | 0.65 | 21 | 1.72 | 0.35 |
| D2 | Rel. unit | 21 | 1.10 | 0.05 | 10 | 1.22 | 0.09 | 21 | 1.10 | 0.06 |
| D3 | Rel. unit | 21 | 1.51 | 0.20 | 10 | 1.91 | 0.36 | 21 | 1.76 | 0.30 |
| D4 | Rel. unit | 21 | 0.96 | 0.01 | 10 | 0.96 | 0.01 | 21 | 0.97 | 0.01 |
| D5 | Rel. unit | 21 | 1.21 | 0.19 | 10 | 1.73 | 0.30 | 21 | 1.22 | 0.17 |
| Physicochemical characteristics of the fatty acid binding sites | | | | | | | | | | |
| $K_B$ | $10^7 M^{-1}$ | 21 | 7.62 | 1.02 | 10 | 16.73 | 2.80 | 21 | 9.18 | 1.63 |
| $N_1^0$ | Rel. unit | 21 | 9.09 | 0.47 | 10 | 6.99 | 0.59 | 21 | 8.93 | 0.52 |
| $R_2$ | Rel. unit | 21 | 0.90 | 0.05 | 10 | 1.12 | 0.10 | 21 | 0.80 | 0.07 |
| $C_P$ | Rel. unit | 21 | 0.34 | 0.01 | 10 | 0.32 | 0.02 | 21 | 0.35 | 0.02 |
| $K_2$ | Rel. unit | 21 | 1.72 | 0.12 | 10 | 1.38 | 0.17 | 21 | 2.11 | 0.17 |
| $L_2$ | Rel. unit | 21 | 1.97 | 0.16 | 10 | 0.72 | 0.47 | 21 | 2.29 | 0.18 |
| Factors of albumin transport, loading and release | | | | | | | | | | |
| $N_1^0$ | Rel. unit | 21 | 9.09 | 0.47 | 10 | 6.99 | 0.59 | 21 | 8.93 | 0.52 |
| $N_T^0$ | Rel. unit | 21 | 17.3 | 1.04 | 10 | 15.0 | 1.56 | 21 | 16.1 | 1.19 |
| $N_L^0$ | Rel. unit | 21 | 17.3 | 1.04 | 10 | 15.0 | 1.58 | 21 | 16.1 | 1.19 |
| $N_U^0$ | Rel. unit | 21 | 18.8 | 1.05 | 10 | 13.6 | 1.11 | 21 | 18.4 | 1.23 |
| $K_T$ | Rel. unit | 21 | 117.9 | 9.7 | 10 | 216.3 | 20.9 | 21 | 125.6 | 15.0 |
| $K_L$ | Rel. unit | 21 | 117.9 | 9.7 | 10 | 216.3 | 20.9 | 21 | 125.6 | 15.0 |
| $D_U$ | Rel. unit | 21 | 0.059 | 0.006 | 10 | 0.041 | 0.005 | 21 | 0.052 | 0.005 |

TABLE 11

ESR parameters of intact and denatured albumin solutions
Screening parameters of the albumin functionality

| Parameter | Unit | Intact albumin | | | Denatured albumin | |
|---|---|---|---|---|---|---|
| | | Number | Mean value | SD | Number | Mean value |
| D1 | Rel. units | 5 | 0.239 | 0.193 | 1 | 0.574 |
| D2 | Rel. units | 5 | 0.784 | 0.058 | 1 | 0.919 |
| D3 | Rel. units | 5 | 0.105 | 0.224 | 1 | 0.668 |
| D4 | Rel. units | 5 | 0.989 | 0.006 | 1 | 0.997 |
| D5 | Rel. units | 5 | 0.170 | 0.185 | 1 | 0.630 |
| Physicochemical characteristics of the fatty acid binding sites | | | | | | |
| $K_B$ | | $K_B$ | 26.5 | 6.3 | 1 | 3.2 |
| $N_1^0$ | Rel. units | $N_1^0$ | 6.30 | 0.86 | 1 | 11.00 |
| $R_2$ | Rel. units | $R_2$ | 0.74 | 0.05 | 1 | 0.53 |
| $C_P$ | Rel. units | $C_P$ | 0.29 | 0.02 | 1 | 0.37 |
| $K_2$ | Rel. units | $K_2$ | 0.46 | 0.26 | 1 | 1.32 |
| $L_2$ | Rel. units | $L_2$ | -3.19 | 2.73 | 1 | 3.06 |
| Factors of albumin transport, loading and release | | | | | | |
| $N_1^0$ | Rel. units | $N_1^0$ | 6.30 | 0.86 | 1 | 11.00 |
| $N_T^0$ | Rel. units | $N_T^0$ | 10.9 | 1.57 | 1 | 16.8 |
| $N_L^0$ | Rel. units | $N_L^0$ | 10.9 | 1.57 | 1 | 16.8 |
| $N_U^0$ | Rel. units | $N_U^0$ | 10.9 | 1.59 | 1 | 19.4 |
| $K_T$ | Rel. units | $K_T$ | 281 | 69 | 1 | 53 |
| $K_L$ | Rel. units | $K_L$ | 281 | 69 | 1 | 53 |
| $D_U$ | Rel. units | $D_U$ | 0.04 | 0.01 | 1 | 0.07 |

FIG. 1:
1 ESR spectrometer
2 Electromagnet
3 Measuring resonator
4 Temperature sensor
5 UHF unit
6 Voltage source
7 Thermostat control system
8 Personal computer
9 Device control and signal registration unit
10 Device control unit
11 Signal processor FIG. 2 shows the induced modification of the binding parameters of spin probes in serum albumin of cancer and non-cancer patients as a result of the effect of alcohol on the albumin molecular conformation. The illustrated curves show the dependence of the spin probe parameters on the alcohol concentration in the serum sample.

A The serum sample includes 50 µl of serum, 10 µl of the alcoholic spin probe solution at a concentration of $0.5 \cdot 10^{-2}$ mol/l; spin probe final concentration $8.33 \cdot 10^{-4}$ mol/l.

B The serum sample includes 50 µl of serum, 12 µl of the alcoholic spin probe solution at a concentration of $0.8 \cdot 10^{-2}$ mol/l; spin probe final concentration $1.55 \cdot 10^{-3}$ mol/l.

C The serum sample includes 50 µl of serum, 14 µl of the alcoholic spin probe solution at a concentration of $1.1 \cdot 10^{-2}$ mol/l; spin probe final concentration $2.41 \cdot 10^{-3}$ mol/l.

[101] . . . [529]: Study codes of patients.

FIG. 3 shows preferred concentrations of spin probe (16-doxylstearic acid) and polar reagent (ethyl alcohol).

The invention claimed is:

1. A method for ESR-spectroscopic investigation of an albumin-containing sample using a spin probe comprising the following steps:
   determining changes in transport properties of albumin in an albumin-containing sample, wherein the determining includes inducing specific conformational changes of the albumin in the sample under investigation by adding at least three different concentrations of a spin probe binding to the albumin and, at least three different concentrations of a polar reagent to aliquots of the sample,
   determining degree of change in parameters of binding of the spin probe to specific binding sites of the albumin as a function of the spin probe concentration and the concentration of polar reagent, with reference to ESR spectra of the aliquots added with the spin probe and the polar reagent, using a computer simulation of the ESR spectra, calculating change in the transport properties of the albumin from the changes of the values of the binding parameters of the spin probe for the conformational states of the albumin induced by the different concentrations of spin probe and polar reagent, wherein the concentrations of spin probe to be added are selected such a that a mean value of the ratio of spin probe concentration to albumin concentration is from 2.0 to 3.0, starting from the mean value, selecting at least two additional concentrations of spin probe whose deviation from the mean value is no less than 1.0 and concentrations of polar reagent to be added, such that a mean value of a final concentration of polar reagent is from (0.35·Cp) to (0.85·Cp), wherein Cp represents a critical concentration of polar reagent, surpassing of which would result in denaturing of the albumin, and starting from the mean value of the final polar reagent concentration, selecting at least two additional concentrations of polar reagent whose deviation from the final polar reagent concentration mean value is at least 15%, and adding spin probe in a concentration deviating not lass than 1.0 from the mean value of the ratio and polar reagent in a concentration between (0.35·Cp) and (0.85·Cp) to respective aliquots of the sample, such that at least one aliquot includes a low concentration of the spin probe and a low concentration of the polar reagent, at least one aliquot includes a medium concentration of the polar reagent and a medium concentration of the spin probe, and at least one aliquot includes a high concentration of the spin probe and a high concentration of the polar reagent.

2. The method according to claim 1, wherein further combinations of concentrations of the spin probe and the polar reagent are selected such that at least one aliquot includes a high concentration of the spin probe and a low concentration of the polar reagent.

3. The method according to claim 2, wherein further combinations of concentrations of the spin probe and the polar reagent are selected such that at least one aliquot includes a low concentration of the spin probe and a high concentration of the polar reagent.

4. The method according to claim 1, wherein a blood sample or a sample of a drug is employed as the albumin-containing sample.

5. The method according to claim 1, wherein spin-labeled fatty acids are used as the spin probe.

6. The method according to claim 5, wherein the spin-labeled fatty acids include doxylstearic acids.

7. The method according to claim 1, wherein an alcohol or DMSO is used as the polar reagent.

8. The method according to claim 7, wherein the alcohol is ethyl alcohol.

9. The method according to claim 1, wherein the parameters of spin probe binding of aliquots of a blood sample are determined at at least one of different temperatures from 15 to 45° C. and different pH values from 7.5 to 3.5.

10. The method according to claim 1, wherein the albumin binding parameters are determined using the mathematical method of regression of the ratio of the binding parameters of the spin probes in the aliquots as a function of the changes in the concentrations of spin probe and the concentrations of polar reagent, and wherein the change in the transport properties of the albumin is calculated using the binding parameters.

11. The method according to claim 1, wherein the method is used for at least one of diagnosing and monitoring physiological or pathological changes in a human or animal body, such that, depending on the physiological or pathological change to be diagnosed, second parameters are determined from the albumin binding parameters, and said second parameters are compared with the cut-off values of reference samples determined using discrimination functions.

12. The method according to claim 11, wherein the method is used for at least one of diagnosing and monitoring oncologic diseases.

13. The method according to claim 12 further comprising determining that an oncologic disease is present if one of the second parameters >1.

14. The method of claim 11, wherein the second parameters are ratios of the relative spin probe concentrations C1, C2, C3 in the fatty acid binding sites between the aliquots.

15. The method according to claim 1, wherein the method is used for determining and monitoring the quality of albumin-containing preparations by comparing the changes of the albumin transport properties with the transport properties of at least one of a starting material in the sample and native serum albumin from healthy subjects.

16. The method of claim 15, wherein the albumin-containing preparations include at least one of a blood preparation and a plasma preparation.

17. The method according to claim 1, wherein an ESR spectrometer is used to perform the method, said spectrometer being comprised of a shielded compact electromagnet with Hall stabilization system (2), a measuring resonator (3) with an intrinsic frequency $f_0$ of 9.45±0.5 GHz, which is coupled to a UHF unit (5) including a controlled main oscillator for tuning the frequency in a range of from $f_0$±100 to $f_0$±200 MHz, a device control and signal registration unit (9), and a system of thermostat control (7) for the samples to be investigated, wherein the measuring resonator (3), in order to control the measuring resonator (3) with respect to compensation of the frequency difference during recording spectra of aliquots of a sample to be investigated, is coupled with another control device to tune the resonance frequency in a range from $f_0$+10 to $f_0$+50 MHz, using resonator cavity volume variation.

18. The method according to claim 17, wherein the thermostat control system (7) of the ESR spectrometer includes an additional control loop to increase the precision of sample temperature stabilization by minimizing the gradients within the resonator chamber by electromagnetic self-heating, which control loop, by controlling the power supply to the electromagnet, controls self-heating thereof during the interruptions in spectrum recording, the heat radiation of which heating the resonator.

19. The method according to claim 17, wherein the resonator body (3) in the ESR spectrometer used is connected to a temperature sensor (4) to control electromagnetic self-heating of the electromagnet, which self-heating effects heating of the resonator up to the actual sample temperature which is 37±0.1° C. for albumin.

20. A test kit for performing the method according to claim 1, wherein the kit comprises:
    sample containers with precisely dosed concentrations of the spin probe and the polar reagent, wherein at least three sample containers include mutually different concentrations of the spin probe and mutually different concentrations of the polar reagent.

21. The test kit according to claim 20, wherein the kit comprises a microtiter plate which includes the selected concentrations of the spin probe and the polar reagent in at least three cavities.

* * * * *